US010075192B2

(12) United States Patent
Han et al.

(10) Patent No.: US 10,075,192 B2
(45) Date of Patent: Sep. 11, 2018

(54) SYSTEMS AND METHODS FOR DATA PROCESSING WITH FOLDED PARITY SECTOR

(71) Applicant: Avago Technologies General IP (Singapore) Pte. Ltd., Singapore (SG)

(72) Inventors: Yang Han, Sunnyvale, CA (US); Keke Liu, Union City, CA (US); Xuebin Wu, San Jose, CA (US); Shaohua Yang, San Jose, CA (US); Avi Steiner, Kiriat Motzkin (IL)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 33 days.

(21) Appl. No.: 15/150,423

(22) Filed: May 9, 2016

(65) Prior Publication Data

US 2017/0324430 A1    Nov. 9, 2017

(51) Int. Cl.
*H03M 13/37* (2006.01)
*G06F 11/10* (2006.01)
*H03M 13/11* (2006.01)
*G06F 3/06* (2006.01)

(52) U.S. Cl.
CPC ........ *H03M 13/3746* (2013.01); *G06F 3/064* (2013.01); *G06F 3/0619* (2013.01); *G06F 3/0644* (2013.01); *G06F 3/0673* (2013.01); *G06F 11/1076* (2013.01); *H03M 13/1128* (2013.01)

(58) Field of Classification Search
None
See application file for complete search history.

(56) References Cited

U.S. PATENT DOCUMENTS

| 5,490,155 A * | 2/1996 | Abdoo ............... G06F 11/1028 714/763 |
| 8,972,836 B2 | 3/2015 | Eliaz |
| 9,214,964 B1 * | 12/2015 | Varnica ............. H03M 13/2909 |
| 2007/0245217 A1 * | 10/2007 | Valle .................. H03M 13/1102 714/758 |
| 2008/0077843 A1 * | 3/2008 | Cho ................... H03M 13/1114 714/801 |
| 2009/0273492 A1 * | 11/2009 | Yang ..................... G11B 20/18 341/81 |
| 2012/0001778 A1 | 1/2012 | Steiner |
| 2013/0275827 A1 | 10/2013 | Wang |
| 2013/0332794 A1 * | 12/2013 | Yen .................. G11B 20/10527 714/758 |

* cited by examiner

*Primary Examiner* — Mujtaba M Chaudry
(74) *Attorney, Agent, or Firm* — Sheridan Ross P.C.

(57) ABSTRACT

An apparatus for processing data includes a decoder configured to iteratively decode codewords in a data block representing a number of user data sectors, the codewords including user data, folded parity sector data and error correction code parity bits. The folded parity sector data includes a number of parity checks, each with multiple user data bits from each of the data sectors, and with an offset between each of the user data bits from the data sectors determined at least in part by a number of folds in the data sectors. The apparatus also includes a scheduler configured to control decoding of the codewords based at least in part on the folded parity sector data.

20 Claims, 6 Drawing Sheets

SYSTEMS AND METHODS FOR DATA PROCESSING WITH FOLDED PARITY SECTOR

FIELD OF THE INVENTION

Various embodiments of the present invention provide systems and methods for processing data, and more particularly to systems and methods for encoding and decoding data including the use of a folded parity sector which wraps parity sector generation over multiple columns.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, parity bits can be added to groups of data bits, ensuring that the groups of data bits (including the parity bits) have either even or odd numbers of ones. The parity bits can be used in error correction systems, including in low density parity check (LDPC) decoders.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components.

DETAILED DESCRIPTION OF THE INVENTION

Figure 1:
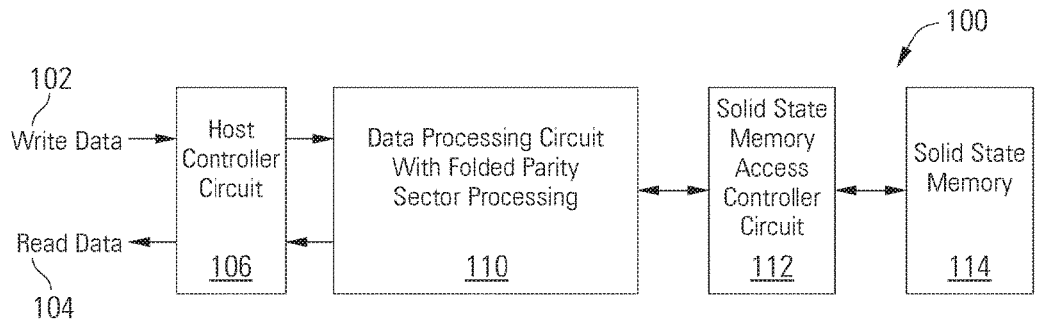
FIG. 1 depicts a storage system including a data processing circuit with folded parity sector processing in accordance with one or more embodiments of the present invention.

Embodiments of the present invention are related to systems and methods for systems and methods for processing data, and more particularly to systems and methods for encoding and decoding data including the use of a folded parity sector which wraps parity sector generation over multiple columns or sections of each protected user data sector. The term "parity sector" is used herein to refer to a sector or group of parity bits associated with a number of other sectors of user data. In other words, parity checks in a folded parity sector each include multiple bits from each of a number of user data sectors. Data sectors are encoded using any encoding algorithm to generate parity bits, such as, but not limited to, low density parity check encoding. The user data along with its parity bits are referred to herein as a codeword. The use of a parity sector shares the parity protection from good codewords which can be decoded to bad codewords which have errors remaining after normal decoding. In some embodiments, a single parity check (SPC) comprises the combination of multiple selected user data bits from each of a number of user data sectors using an XOR operation to generate a single parity check bit. The selection of the multiple user data bits from each user data sector can be viewed as folding or wrapping the user data sector into an array of columns each containing a section of the sector data, so that a slice or row through the array of columns includes a number of the user data bits, typically separated from each other in the sector by an offset determined in part by the length U of the sector and the number F of folds. In some embodiments, the single parity check (SPC) bits are divided among the data sectors being protected by the folded parity sector and are encoded with the user data to provide error correction protection to the single parity checks as well as the user data using any suitable encoding algorithm, such as, but not limited to, low density parity check encoding.

The terms "folded" and "wrapped" refer herein to the layout of user data sectors when combining bits from multiple user data sectors to generate a parity sector. Rather than an array of user data sectors each laid out in a straight line, for example in adjacent vertical columns, with each XOR operation being performed on a single bit selected from each of the user data sectors along a horizontal row, the folded or wrapped user data sectors are folded back on themselves. This can be represented visually with each user data sector laid out in a zigzag, so that each XOR operation along a row is performed on multiple bits selected from each of the user data sectors. In other words, the terms "folded" and "wrapped" refer herein to the configuration by which multiple bits from each of a number of user data sectors in a block of data are combined to generate parity bits in a folded parity sector. The combining of bits to generate parity bits can be performed using XOR operations, but is not limited to this particular algorithm.

In general, the folded parity sectors are applied during decoding during several decoding phases. In the first phase, during a normal read of data, the codeword for a sector is decoded, and if the codeword converges, meaning that all parity checks in the codeword are satisfied, the syndrome for the converged codeword is accumulated. A low density parity check code is defined by a sparse parity check matrix H of size m×n, where m<n. A codeword c of length n satisfies all the m parity check equations defined by H, i.e., $cH^T=0$, where 0 is a zero vector. Decoder convergence is checked by determining whether the syndrome $s=cH^T$ is all zero. The syndrome is a vector of length m, with each bit corresponding to a parity check. A zero bit in a syndrome means the check is satisfied, while a non-zero bit in the syndrome is an unsatisfied check (USC). By definition, a codeword has syndrome s=0. A non-codeword has a non-zero syndrome. Accumulating or storing the syndrome for converged sectors means that the parity check results for converged sectors are stored.

If a sector fails to converge during phase 1 decoding, the hard decision inputs to the decoder for the failed sectors are stored in a buffer, and they are reprocessed in a retry decoding operation in phase 2 processing, using any type of error recovery techniques that might aid in converging on the correct data values. This can include using the additional parity bits from the parity sector to help determine the correct data values in the failed sectors. If the sectors processed during phase 2 converge, their syndromes are accumulated. For sectors that again fail to converge, their hard decision inputs and soft information are stored in a buffer for reprocessing in a retry decoding operation in phase 2 processing. As used herein, the phrase "soft information" is used in its broadest sense to mean reliability data with each instance of the reliability data indicating a likelihood that the value of a bit or symbol has been correctly determined. In some embodiments of the present invention, the soft information or reliability data is log likelihood ratio data as is known in the art. In some embodiments, the likelihood values are log likelihood ratios.

If the sector fails to converge during phase 2 decoding, the hard decision inputs and the soft information for the failed sectors are reprocessed in another retry decoding operation in phase 3 processing, using any type of error recovery techniques that might aid in converging on the correct data values. This can include using hard decisions and soft information for the data in the parity sector to help determine the correct data values in the failed sectors. If the sectors processed during phase 2 converge, their syndromes are accumulated. For sectors that again fail to converge, their hard decision inputs and soft information are updated in the buffer for further reprocessing, for example in additional decoding iterations. Soft information can be gathered in any suitable manner, such as in a min-sum based low density parity check decoder, in a detector such as a Viterbi algorithm or maximum a posteriori algorithm detector, in a flash memory storage system with multiple voltage threshold read operations, etc.

Folded parity sector processing as disclosed herein is not limited to use with any particular storage system or transmission system. Folded parity sector processing as disclosed herein is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, memory devices such as DRAM, NAND flash, NOR flash, other non-volatile memories and solid state drives, hard disk drives, compact disks, digital video disks, magnetic tapes, etc.

When a storage controller issues a read command for a multi-sector data block, page or data track, each sector in the data block is retrieved by the head assembly and data corresponding to the sector is processed. The terms data block, page or data track are used generically herein to refer to a group of data sectors or codewords stored or transmitted by any means, in which each data sector is independently encoded with parity bits for that sector, and whose data sectors are collectively encoded with parity bits to generate an additional parity sector or parity codeword of parity bits. In some embodiments, the data sectors are collectively encoded to generate a folded parity sector before dividing the parity bits of the folded parity sector among the data sectors and applying further error correction encoding, such as low density parity check encoding, thereby protecting the parity bits of the folded parity sector by the further error correction encoding. In some other embodiments, the parity bits of the folded parity sector are generated after low density parity check encoding of the individual data sectors in the block, or the parity bits of the folded parity sector are otherwise omitted from the low density parity check encoding.

The folded parity sector disclosed herein shares parity protection from good codewords to bad codewords. Different storage device or transmission characteristics can render decoding more effective or successful for some data sectors than others. For example, in a flash memory storage system, different dies, blocks or pages can have different quality. The folded parity sector enables bad codewords to "borrow" coding power from good codewords during decoding with an extremely efficient encoding and decoding process. The folding of the parity sector enables the overall code rate to be maintained while reducing or minimizing the number of data sectors needing to be grouped together by one folded parity sector, thereby also reducing decoding latency and reducing the number of codewords that are buffered in the system during decoding. The folded parity sector provides a scalable solution which reduces buffer hardware requirements and which provides a performance/latency tradeoff that can be balanced by controlling the number of codewords or data sectors included in the block and the number of times each data sector is folded as the single parity check bits are generated to form the folded parity sector.

Turning to FIG. 1, a storage system 100 is shown that includes a data processing circuit 110 having with folded parity sector processing in accordance with one or more embodiments of the present invention. A host controller circuit 106 receives data to be stored (i.e., write data 102). This data is provided to data processing circuit 110 where it is encoded as disclosed above to include a folded parity sector. The encoded data is provided to a solid state memory access controller circuit 112. Solid state memory access controller circuit 112 can be any circuit known in the art that is capable of controlling access to and from a solid state memory. Solid state memory access controller circuit 112 formats the received encoded data for transfer to a solid state memory 114. Solid state memory 114 can be any solid state memory known in the art. In some embodiments of the present invention, solid state memory 114 is a flash memory. Later, when the previously written data is to be accessed from solid state memory 114, solid state memory access controller circuit 112 requests the data from solid state memory 114 and provides the requested data to data processing circuit 110. In turn, data processing circuit 110 decodes the received data, using the folded parity sectors to assist in decoding the codewords. The decoded data is provided to host controller circuit 106 where it is passed on as read data 104.

Figure 2:
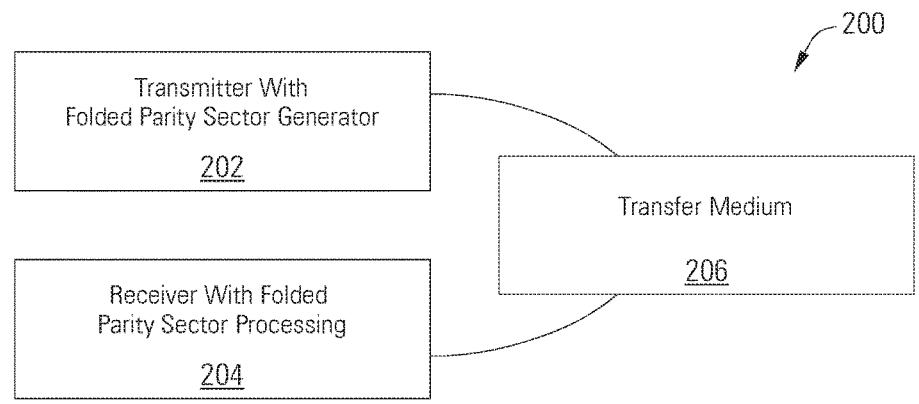
FIG. 2 depicts a wireless communication system including a receiver with folded parity sector processing in accordance with one or more embodiments of the present invention.

Turning to FIG. 2, a wireless communication system 200 or data transmission device including a receiver 204 with a data processing system with folded parity sector processing is shown in accordance with some embodiments of the present invention. The transmitter 202 is operable to encode data blocks as disclosed above, wherein each sector in a block is encoded with its own parity bits, and wherein the block is encoded with parity bits for the combined sectors to form a folded parity sector, and to transmit the encoded block information via a transfer medium 206. The encoded data is received from transfer medium 206 by receiver 204. Receiver 204 incorporates a data processing system with folded parity sector processing.

Figure 3:
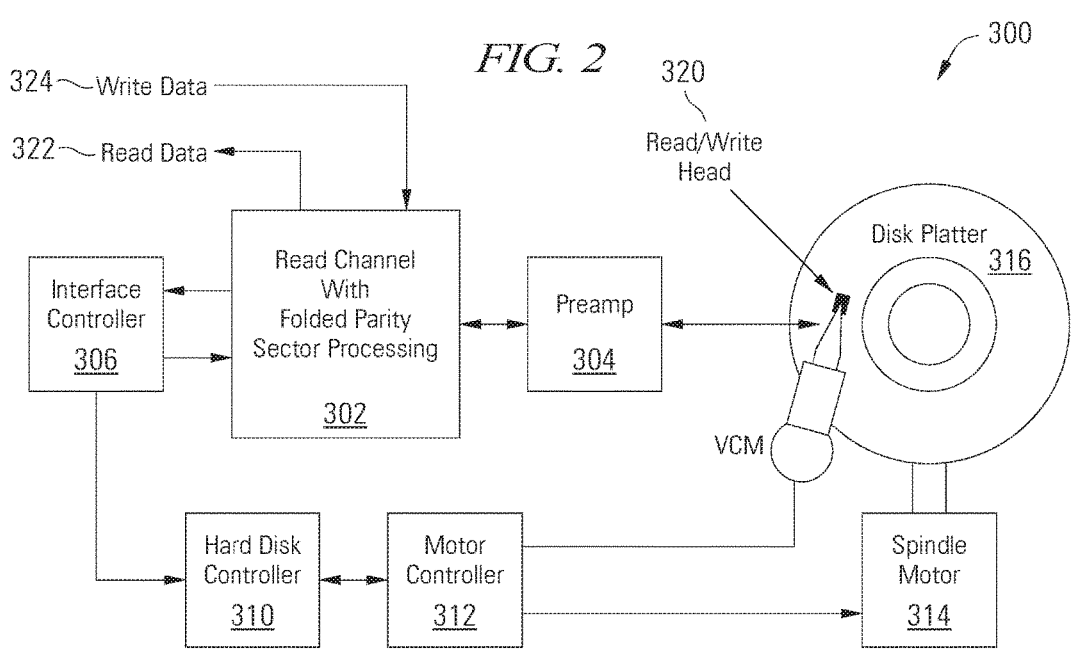
FIG. 3 depicts a storage system including a read channel with folded parity sector processing in accordance with one or more embodiments of the present invention.

Turning to FIG. 3, a storage system 300 is depicted with a read channel with folded parity sector processing in accordance with some embodiments of the present invention. The storage system 300 includes a read channel circuit 302 with track quality classification in accordance with one or more embodiments of the present invention. Storage system 300 may be, for example, a hard disk drive. Storage system 300 also includes a preamplifier 304, an interface controller 306, a hard disk controller 310, a motor controller 312, a spindle motor 314, a disk platter 316, and a read/write head assembly 320. Interface controller 306 controls addressing and timing of data to/from disk platter 316. The data on disk platter 316 consists of groups of magnetic signals that may be detected by read/write head assembly 320 when the assembly is properly positioned over disk platter 316. In one embodiment, disk platter 316 includes magnetic signals recorded in accordance with either a longitudinal or a perpendicular recording scheme.

In a typical read operation, read/write head assembly 320 is accurately positioned by motor controller 312 over a desired data track on disk platter 316. Motor controller 312 both positions read/write head assembly 320 in relation to disk platter 316 and drives spindle motor 314 by moving read/write head assembly 320 to the proper data track on disk platter 316 under the direction of hard disk controller 310. Spindle motor 314 spins disk platter 316 at a determined spin rate (RPMs). Once read/write head assembly 320 is positioned adjacent the proper data track, magnetic signals representing data on disk platter 316 are sensed by read/write head assembly 320 as disk platter 316 is rotated by spindle motor 314. The sensed magnetic signals are provided as a continuous, minute analog signal representative of the magnetic data on disk platter 316. This minute analog signal is transferred from read/write head assembly 320 to read channel circuit 302 via preamplifier 304. Preamplifier 304 is operable to amplify the minute analog signals accessed from disk platter 316. In turn, read channel circuit 302 digitizes and decodes the received analog signal to recreate the information originally written to disk platter 316. This data is provided as read data 322 to a receiving circuit. While processing the read data, read channel circuit 302 retains hard decisions and soft information for failed sectors, enabling reprocessing of a failed sector using the retained hard decisions and soft information along with information in the folded parity sector. A write operation is substantially the opposite of the preceding read operation with write data 324 being encoded and folded parity sectors being generated and provided to read channel circuit 302.

It should be noted that storage system 300 can be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAM storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 300, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that storage system 300 can be modified to include solid state memory that is used to store data in addition to the storage offered by disk platter 316. This solid state memory may be used in parallel to disk platter 316 to provide additional storage. In such a case, the solid state memory receives and provides information directly to read channel circuit 302. Alternatively, the solid state memory can be used as a cache where it offers faster access time than that offered by disk platter 316. In such a case, the solid state memory can be disposed between interface controller 306 and read channel circuit 302 where it operates as a pass through to disk platter 316 when requested data is not available in the solid state memory or when the solid state memory does not have sufficient storage to hold a newly written data set. Based upon the disclosure provided herein, one of ordinary skill in the art will recognize a variety of storage systems including both disk platter 316 and a solid state memory that can be used in relation to various embodiments of the invention.

Figure 4:
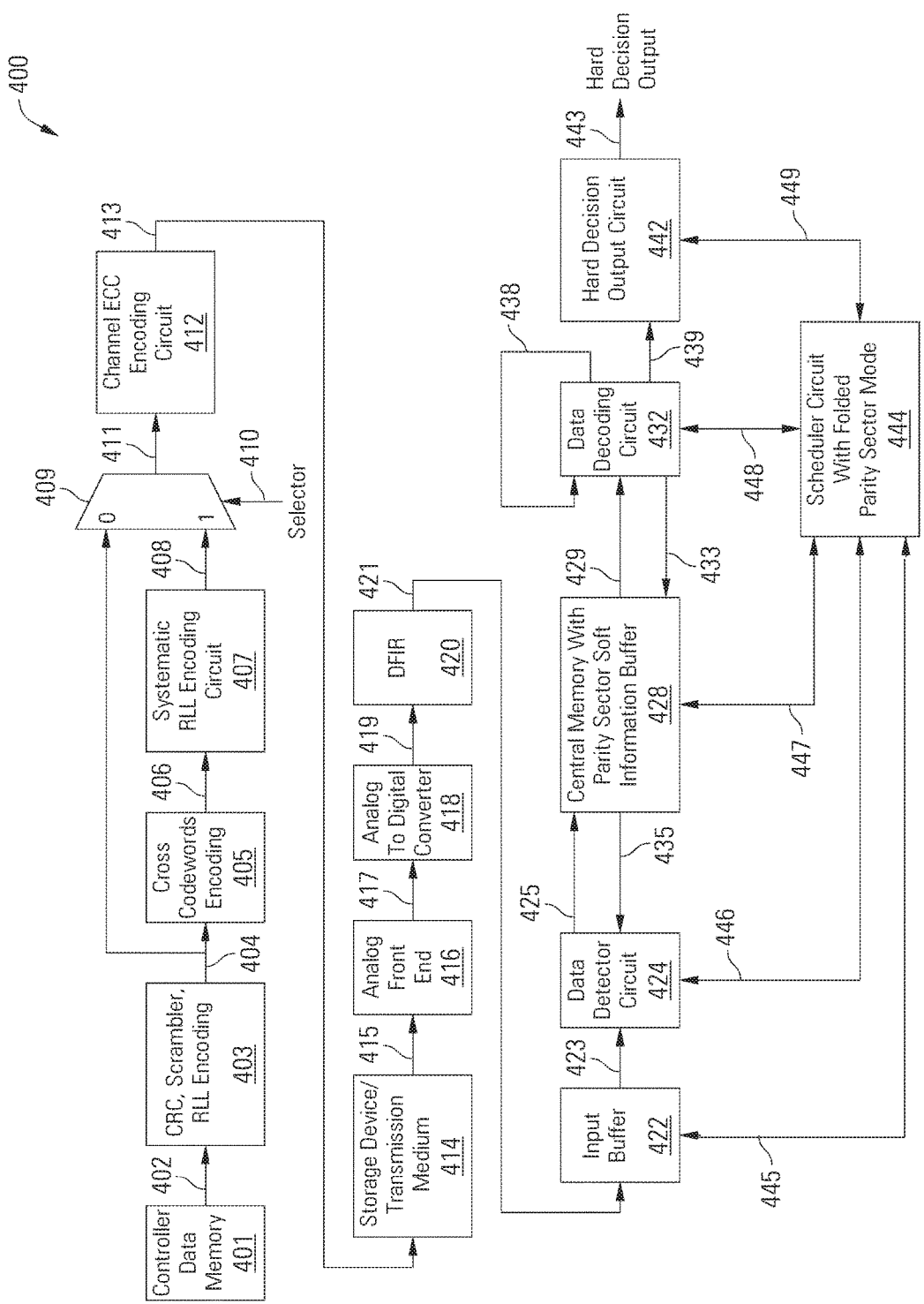
FIG. 4 depicts a read channel with folded parity sector processing in accordance with some embodiments of the present invention.

Turning to FIG. 4, an example read channel 400 with folded parity sector processing is depicted in accordance with some embodiments of the present invention. Data 402 to be stored or transmitted is provided from a controller data memory 401. The stored data 402 is provided to a first level encoding circuit 403 that applies first level encoding to yield a first level encoded output 404. The encoding applied by first level encoding circuit 403 may include, for example, run length limited encoding, cyclic redundancy check encoding, scrambling and/or other known encoding processes.

First level encoded output 404 is provided to both a selector circuit 409 and a cross codewords encoding circuit 405. Cross codewords encoding circuit 405 applies an encoding algorithm to two or more of the codewords provided as first level encoded output 404 to yield an interim codeword 406. In some cases, the cross codewords encoding includes XORing multiple corresponding bit positions from multiple folded sectors or codewords provided as first level encoded output 404 to generate an encoding bit with a particular parity (e.g., odd or even parity) for the bit positions in interim codeword 406. Interim codeword 406 is provided to a systematic run length limited encoding circuit 407 that applies run length limited encoding as is known in the art to yield a cross codewords error correction codeword 408, also referred to herein as a folded parity sector. Cross codewords error correction codeword 408 is provided to selector circuit 409.

Selector circuit 409 selects one of cross codewords error correction codeword 408 or codewords (sectors) in first level encoded output 404 to yield a channel encoder input codeword 411. Channel encoder input codeword 411 is provided to a channel error correction code (ECC) encoder 412 that applies an encoding algorithm to each of the codewords (i.e., each of the codewords provided as first level encoded output 404 and cross codewords error correction codeword 408) to yield an encoded output 413 representing a track containing multiple sectors or codewords. Encoded output 413 is then written to a storage medium 414 or transmitted over a transmission medium. In some embodiments, the encoding algorithm applied by channel ECC encoder 412 is a low density parity check encoding algorithm as is known in the art. In such a case, encoded output 413 is a low density parity check encoded output.

In some embodiments, the read channel 400 includes an analog front end 416 that receives the stored or transmitted encoded information as an analog input 415. Analog front end 416 processes analog input 415 and provides a processed analog signal 417 to an analog to digital converter 418. Analog front end 416 may include, but is not limited to, an analog filter and an amplifier circuit as are known in the art. Based upon the disclosure provided herein, one of ordinary skill in the art will recognize a variety of circuitry that may be included as part of analog front end 416. In some cases, analog input 415 is derived from a read/write head assembly (e.g., 320) that is disposed in relation to a storage medium (e.g., 316). In other cases, analog input 415 is derived from a receiver circuit (e.g., 204) that is operable to receive a signal from a transmission medium (e.g., 206). The transmission medium may be wired or wireless. Based upon the disclosure provided herein, one of ordinary skill in the art will recognize a variety of source from which analog signal 415 may be derived.

Analog to digital converter 418 converts processed analog signal 417 into a corresponding series of digital samples 419. Analog to digital converter 418 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 419 are provided to an equalizer circuit 420. Equalizer circuit 420 applies an equalization algorithm to digital samples 419 to yield an equalized output 421. In some embodiments of the present invention, equalizer circuit 420 is a digital finite impulse response (DFIR) filter circuit as are known in the art. It may be possible that equalized output 421 may be received directly from a storage device in, for example, a solid state storage system. In such cases, analog front end 416, analog to digital converter 418 and equalizer circuit 420 may be omitted where the data is received as a digital data input. Equalized output 421 is stored to an input buffer 422 that includes sufficient memory to maintain one or more codewords until processing of that codeword is completed through a data detector circuit 424 and a data decoding circuit 432 including, where warranted, multiple global iterations (processing passes through both data detector circuit 424 and data decoding circuit 432) and/or local iterations (processing passes through data decoding circuit 432 during a given global iteration).

Stored data sectors 423 from input buffer 422 are provided to data detector circuit 424, which is operable to apply a data detection algorithm to a received sector or codeword. In some embodiments of the present invention, data detector circuit 424 is a Viterbi algorithm data detector circuit as are known in the art. In other embodiments of the present invention, data detector circuit 424 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or hi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention.

Upon completion of application of the data detection algorithm to the received sector on the first global iteration, data detector circuit 424 provides a detector output 425. Detector output 425 includes soft information. Detected output 425 is stored in central memory circuit 350.

Once a data decoding circuit 432 is available, a previously stored sector is accessed from central memory circuit 428 by data decoding circuit 432 as a decoder input 429. In some embodiments of the present invention, the data decode algorithm is a low density parity check (LDPC) algorithm as are known in the art. Based upon the disclosure provided herein, one of ordinary skill in the art will recognize other decode algorithms that may be used in relation to different embodiments of the present invention. Data decoding circuit 432 applies a data decode algorithm to decoder input 429 to yield a decoded output 438. In cases where another local iteration (i.e., another pass through data decoder circuit 432) is desired, data decoding circuit 432 re-applies the data decode algorithm to decoder input 429 guided by decoded output 438. This continues until either a maximum number of local iterations is exceeded or decoded output 438 converges.

Where decoded output 438 fails to converge (i.e., fails to yield the originally written data set) and a number of local iterations through data decoder circuit 432 exceeds a threshold, the resulting decoded output 433 is stored in central memory circuit 428 to await another global iteration through data detector circuit 424. When the data detector circuit 424 becomes available, a previously stored sector that was previously processed in data decoding circuit 432 is retrieved from central memory circuit 428 by data detector circuit 424 where it is used to guide subsequent detection of the corresponding sector in input buffer 422.

Alternatively, where the decoded output converges (i.e., yields the originally written data set), the resulting decoded output is provided as an output codeword 439 to a hard decision output circuit 442. Hard decision output circuit 442 is operable to re-order track data as needed back into the original order. The hard decision output 443 can then be used in any suitable manner, such as providing it to a hard disk controller circuit that requested the data be read.

A scheduler circuit 444 controls the application of the data detection algorithm to data sectors by the data detector circuit 424 and of the data decode algorithm to data sectors by the data decoding circuit 432. When a data sector has been reached a predetermined limit on the number of global iterations in the data detector circuit 424 and data decoding circuit 432 without converging, the scheduler circuit 444 issues a kickout causing processing of the failed sector to be terminated and the processing results of the failed sector to be output. Data for the failed sector can be cleared from the input buffer 422 and central memory 428 if room is needed to process other sectors being read, or the failed sector data can be retained in the input buffer 422 and central memory 428 for later reprocessing. The scheduler circuit 444 also controls the gathering and retention of soft information from the data detector circuit 424 and/or data decoding circuit 432 for folded parity sector modes and reprocessing of failed sectors. To facilitate this control, the scheduler circuit 444 can be provided with one or more connections 445, 446, 447, 448, 449 as needed to the input buffer 422, data detector circuit 424, central memory 428, data decoding circuit 432 and hard decision output circuit 442, respectively. The scheduler circuit 444 can be implemented in any suitable circuit to receive read commands, monitor detection/decoding process, control storage of sector information in the input buffer 422 and central memory 428, gather failed sector and parity sector soft information, and control reprocessing of failed sectors. For example, scheduler circuit 444 can be implemented in dedicated logic circuits, state machines, microcontrollers, microprocessors, etc. Based upon the disclosure provided herein, one of ordinary skill in the art will recognize a variety of scheduler circuits that may be used in relation to different embodiments of the present invention.

The central memory 428 includes a dedicated buffer to store soft information for all retained sectors, used to generate parity sector soft information. In some embodiments, the data decoding circuit 432 is a non-binary min-sum based low density parity check decoder, which passes log likelihood ratio (LLR) values iteratively between a variable node processor and a check node processor. Each multi-bit symbol in the sector or codeword being decoded can have one of a number of values, with those possible values being selected from a finite Galois field. The variable node processor updates the perceived value of the symbols in response to parity checks performed by the check node processor. The check node processor applies parity checks to log likelihood ratios for symbol values from the variable node processor, using a min-sum based algorithm. In the min-sum based algorithm, the check node processor identifies the minimum log likelihood ratio value, next-minimum log likelihood ratio value, and the index of the minimum log likelihood ratio value for each symbol in the sector. In these embodiments, the dedicated buffer in central memory 428 stores the minimum (min1), next-minimum (min2) and index (minind) for each symbol or bit in the parity sector.

In some embodiments, the central memory 428 also includes a dedicated buffer for hard decisions (HD) of retained sectors, those sectors of a track that failed to converge during normal processing in the data detector circuit 424 and data decoding circuit 432 before the maximum number of global iterations was reached. These hard decisions, generated in data decoding circuit 432, are buffered to facilitate parity sector soft information generation. Each retained sector is retained once to collect its soft information. The parity sector soft information of a target failed sector is then generated from the min1/min2/minind/buffered hard decisions stored in the central memory 428. Parity sector reprocessing only occupies one slot in the central memory 428, so that normal sector reading is not blocked. This enables reprocessing of a retained sector from a previous track to be overlapped with reading of a new track.

Again, the min1/min2/minind soft information is stored in central memory 428 for every retained sector of a track. In some embodiments, soft information is collected from the output 425 of the data detector circuit 424 to reduce the memory bandwidth. However, it can also be gathered from the decoder output 433 from the data decoding circuit 432. The gathering of the min1/min2/minind soft information can be performed according to the following pseudo-code:

```
Initialize: for each symbol and each LLR,
                min1 ← maximum value, min2 ← maximum
                value, minind = -1
For each incoming sector
    For each symbol
        For each LLR:
            if incoming LLR < min1
                min2 ← min1, min1 ← incoming LLR, minind ←
                sector index
            else if incoming LLR < min2
                min2 ← incoming LLR
            sign = sign XOR HD; (where sign is the sign of the hard
            decision)
```

For each converged sector in the track, its hard decision is accumulated to a syndrome buffer, enabling error correction across the track based on the parity sector based on the algorithm used to generate the parity sector. The syndrome buffer can be located in the central memory 428 or in any other suitable location. Hard decisions for converged sectors are accumulated in the syndrome buffer as follows: syndrome ← syndrome XOR hard decisions. Again, the cross codeword encoding performed in the write portion of the read channel can include XORing all corresponding bit positions in the multiple sectors or codewords, with a corresponding parity bit in the parity sector being generated to yield a particular parity (e.g., odd or even parity) for the bit position. Accumulation of hard decisions for converged sectors plays a part in reversing this process, performing error correction across the track based on the folded parity sector.

Parity sector soft information can be generated during reprocessing based on the soft information and hard decisions stored to the central memory 428 as disclosed above. The generation of the parity sector soft information, and updating of corresponding hard decisions, can be performed according to the following pseudo-code:

```
Input: sectorindex: target failed sector index, syndrome, 2nd syndrome, HD
buffer
For each symbol of the failed sector
    if(sectorindex == minind)
        psSoft = min2;
    else
        psSoft = min1;
    psHard = syndrome XOR 2nd syndrome XOR HD[sectorindex] XOR
    sign
```

Figure 5:
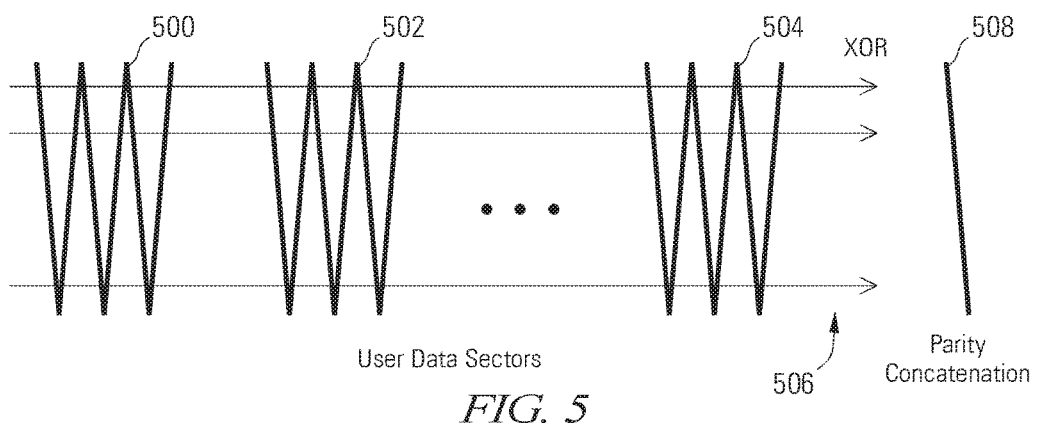
FIG. 5 depicts a diagram representing the generation of a folded parity sector based on multiple user data sectors in accordance with some embodiments of the present invention.

Again, the single parity check bits that provide cross-codeword error protection are included with the user data that is stored or transmitted. The single parity checks are generated with any suitable operation for combining bits, such as an XOR operation. As depicted in FIG. 5, multiple user data sectors (e.g., 500, 502, 504) are folded or wrapped so that each XOR operation 506 is based on multiple data bits from each user data sector (e.g., 500, 502, 504) to yield the single parity check (SPC) bits 508 or parity concatenation. By folding the user data sectors (e.g., 500, 502, 504), a particular overall code rate can be maintained with fewer data sectors grouped by the folded parity sector. This results in a shorter SPC block and lower decoding latency, since fewer codewords need to be decoded to apply the parity checks in the folded parity sector during decoding.

Parameters associated with the folded parity sector can be controlled to balance the performance/latency tradeoff by controlling the number of codewords or data sectors included in the block and the number of times each data sector is folded as the single parity check bits are generated to form the folded parity sector. For a fixed code rate Rall, if the number F of times that user sectors are folded is increased, the outer code rate Ro is increased. The folded parity sector system disclosed herein can be interpreted as a concatenation of an inner code and an outer code. The overall code rate Rall corresponds to the multiplication of the inner code rate and the outer code rate. If the number F of folds is increased (which means the code is weaker), that increases the outer code rate, which weakens the outer code. However, the increased folding will lower and strengthen the inner code rate, balancing the inner and outer code rate. The values of these variables can be selected, for example, by performing exhaustive trials, scanning through possible values of the variables such as the number of folds F, the amount U of controller user data per LDPC codeword, and the number of parity bits M per codeword, to find the combination of values that give the desired performance for a given system. In one non-limiting example, an 8 KB data block is used with four 2 KB component codewords. Each controller user data sector contains U=2 KB of data per LDPC codeword. Each LDPC codeword in this example comprises a quasi-cyclic LDPC codeword with M parity bits. The outer parity sector code rate Ro=4F/(4F+1), and the overall code rate Rall=4U/(4U+4M+U/F). In another non-limiting example, a 16 KB data block is used with eight 2 KB component codewords. Each controller user data sector contains U=2 KB of data per LDPC codeword. Each LDPC codeword in this example comprises a quasi-cyclic LDPC codeword with M parity bits. The outer parity sector code rate Ro=8F/(8F+1) and the overall code rate Rall=8U/(8U+8M+U/F). For a fixed overall code rate Rall, increasing the number F of folds increases the outer code rate Ro, increasing the number M of parity bits, and decreasing the inner code rate Ri or component LDPC code rate.

When decoding each component codeword, the decoder can be initialized with appropriate values from the channel input or from previous decoding iterations according to the decoding algorithm being applied. For example, in a min-sum based LDPC decoder, memory in the decoder is initialized with min1/min2/idx values each time the decoding of a component codeword begins. In other words, these embodiments do not begin a decoding operation with the full decoder state that previous decoding of the component codeword left in the decoder. In some other embodiments, at the cost of some extra hardware, the decoder is configured to mimic the performance of decoding the whole block using carry-on decoding, by including the buffer or memory in the decoder to store the previous iteration state rather than reinitializing each time the decoding of a component codeword begins. This allows the decoding performance for the whole block to more closely mimic decoding performance of the sectors in the block.

The number of folds in each of the user data sectors (e.g., 500, 502, 504) is not limited to any particular value, and in some embodiments, is a programmable parameter. Furthermore, the specific folding pattern of the user data sectors (e.g., 500, 502, 504) is not limited to any particular pattern such as the diagonal wrapped lines shown in FIG. 5. In practice, any algorithm can be applied to select multiple bits from each user data sector (e.g., 500, 502, 504) for inclusion in the XOR or other operation to generate the SPC bits.

Figure 6:
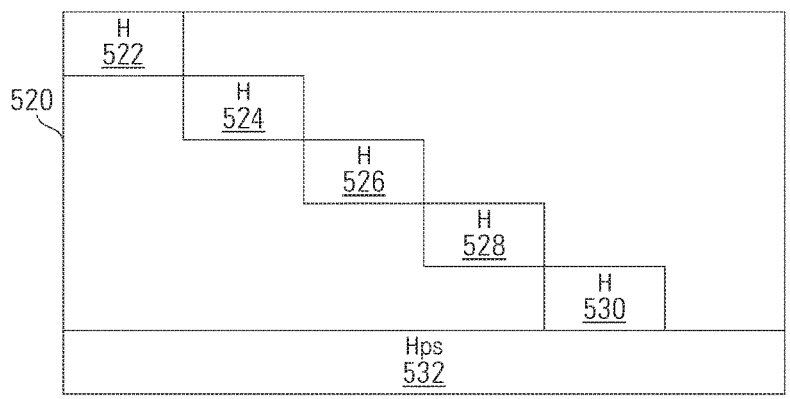
FIG. 6 depicts a parity check matrix with a folded parity sector protecting a number of user data sectors in accordance with some embodiments of the present invention.

Turning to FIG. 6, a parity check matrix 520 with a folded parity sector 532 protecting a number of user data sectors is depicted in accordance with some embodiments of the present invention. The parity check matrix 520 represents connections between bit values (or variables) and parity checks. In some embodiments, columns in the parity check matrix 520 represent bits in the data block and rows in the parity check matrix 520 represent parity checks. A 1 at any node or intersection between a column and row in the matrix indicates that the bit represented by the column is included in the parity check represented by the row.

Each user data sector in the block, along with a fraction of the SPC bits for the block, is encoded to yield component codewords, for example using low density parity check encoding. The parity check matrix or H matrix 522, 524, 526, 528, 530 for each component codeword is combined with the H matrix 532 for the folded parity sector to provide cross-codeword protection. The additional parity checks in the block provided by the folded parity sector are depicted in the parity check matrix 520 as the bottom layer 532 of the overall matrix 520. Just as the design of a low density parity check H matrix (e.g., 522, 524, 526, 528, 530) can be designed by one skilled in the art to improve decoding performance, reduce or prevent trapping sets, reduce latency, or facilitate decoding scheduling in any manner, so the folded parity sector H matrix 532 can be designed with a view to meeting a variety of objectives, using the same techniques as designing low density parity check matrices.

Figure 7:
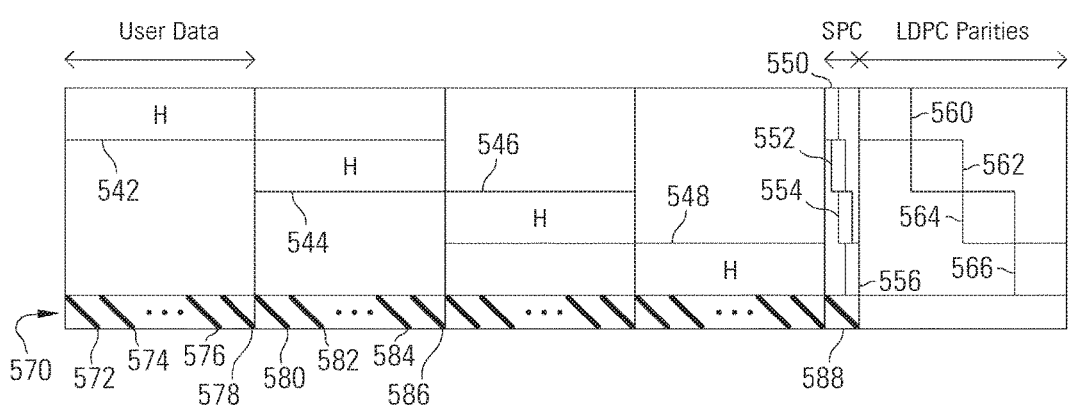
FIG. 7 depicts a parity check matrix with folded parity sector single parity checks (SPCs) and low density parity check (LDPC) parity bits protecting a number of user data sectors, wherein the SPC bits are included in the LDPC codewords for LDPC protection in accordance with some embodiments of the present invention.

Turning to FIG. 7, a parity check matrix 540 is depicted with folded parity sector single parity checks (SPCs) and low density parity check (LDPC) parity bits protecting a number of user data sectors, wherein the SPC bits are included in the LDPC codewords for LDPC protection in accordance with some embodiments of the present invention. The parity check matrix 540 represents the mapping or connectivity between bits (columns) and parity checks (rows). The width of the parity check matrix 540 is dependent on the sector length and the number of sectors grouped for protection by the folded parity sector.

Regions 542, 544, 546, 548 represent controller user data, or user data from a storage controller or transmitter controller, for four data sectors. The SPC bits calculated for the four data sectors are divided into four portions 550, 552, 554, 556 each associated with one of the user data sectors, and the user data and SPC bits are encoded, for example using LDPC encoding, to yield LDPC parity bits 560, 562, 564, 566. For example, user data associated with region 542 is combined with SPC bits 550 and LDPC encoded to yield LDPC parity bits 560. The user data associated with region 542, along with portion 550 of the SPC bits and their LDPC parity bits 560 form the first codeword. User data associated with region 544 is combined with SPC bits 552 and LDPC encoded to yield LDPC parity bits 562, together forming the second codeword. User data associated with region 546 is combined with SPC bits 554 and LDPC encoded to yield LDPC parity bits 564, together forming the third codeword. User data associated with region 546 is combined with SPC bits 556 and LDPC encoded to yield LDPC parity bits 566, together forming the fourth codeword. For a linear code, the newly calculated folded parity sector is also a codeword. Although four LDPC codewords are grouped and protected by a folded parity sector in the H matrix of FIG. 7, any number of codewords can be grouped for a folded parity sector.

The bottom layer 570 of the parity check matrix 540 represents the folded parity sector and defines parity checks that span the grouped user data sectors. Each row of the folded parity sector portion of the parity check matrix identifies the bits to be included in a parity check operation, including multiple bits from each user data sector and a single parity check bit, which are combined or added in an XOR operation and sums to 0 when the parity check is satisfied. Each diagonal line (e.g., 572, 574) of the folded parity sector layer 570 of the parity check matrix 540 shows the placement of bits or columns with a value of '1' in each row, indicating that those bits are included in the parity check of each row. In the top row, for example, four diagonal lines 572, 574, 576, 578 in the controller user data for the first sector 542 contain four bits with a value of '1' identifying the user data bits from the first sector 542 to be included in the parity check of the top row, for example at columns X+1, 2X+1, 3X+1 and 4X+1, where X is the offset or distance between each selected bit in the sector 542, determined by the size of the sector and the number of folds. Four diagonal lines 580, 582, 584, 586 in the controller user data for the second sector 544 contain four bits with a value of '1' identifying the columns X+1, 2X+1, 3X+1 and 4X+1 to be included in the parity check of the top row from the second sector 544. Similar diagonal lines identify the user data bits to be included from the third and fourth sectors 546, 548 in the parity check of the top row. The user data bits are added or XORed together to yield the SPC bit in the top row of the diagonal line 588 for the SPC section of the parity check matrix 540. To perform the parity check represented by the top row of layer 570 during decoding, the user data bits and SPC bit identified in the top row are XORed together, and if the resulting value is 0, the parity check is satisfied indicating that all the bits are likely correct. The value of the user data bits and SPC bit are determined during the decoding process for each data sector and for the SPC bits representing the folded parity sector.

Similarly, the other rows in the folded parity sector layer 570 of the parity check matrix 540 specify the bits that are included in other parity checks. For example, in the second row, the four diagonal lines 572, 574, 576, 578 in the controller user data for the first sector 542 contain four bits with a value of identifying the user data bits from the first sector 542 to be included in the parity check of the top row, for example at columns X+2, 2X+2, 3X+2 and 4X+2 and so on. Again, the H matrix for the folded parity sector can be designed in any suitable manner, and the diagonal lines (e.g., 572, 574) and the number of folds and therefore bits per parity check per sector are merely a non-limiting example. Other more complex arbitrary parity check matrices can be used to implement other protection schemes. As shown in FIG. 7, in some embodiments the LDPC parity bits are not included in the folded parity sector parity checks as the SPC bits 550, 552, 554, 556 are protected by the LDPC parity bits, although the folded parity sector is not limited to this particular implementation.

Figure 8:
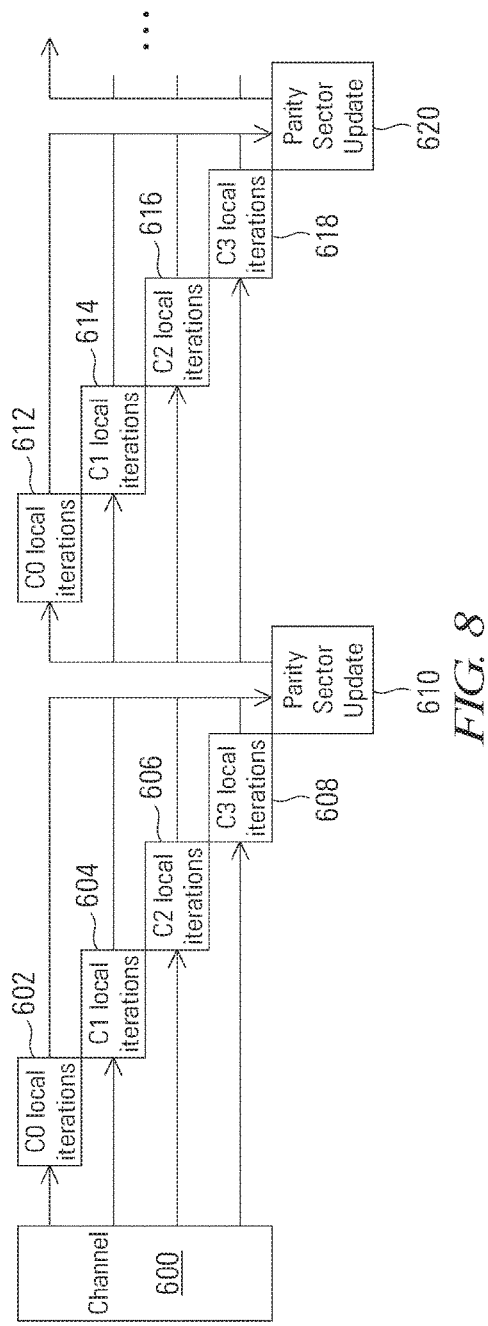
FIG. 8 depicts a scheduling diagram for a decoding operation for a data block with a folded parity sector in accordance with some embodiments of the present invention.

Turning to FIG. 8, a scheduling diagram is depicted for a decoding operation for a data block with a folded parity sector in accordance with some embodiments of the present invention. In this example, four codewords C0 602, C1 604, C2 606, and C3 608 are decoded in a decoder in a number of local decoding iterations. In some embodiments, the decoder is an iterative low density parity check decoder. Data input to the decoder is initially received from a channel 600, such as a read channel for a flash storage device or hard disk drive. In some embodiments, the data is filtered and equalized, a data detection algorithm is applied to generate hard decisions and, in some cases, soft information about the value of the data bits, and the resulting data can be buffered for input to the decoder. In the example embodiment of FIG. 8, decoding operations 602, 604, 606, 608 for each of the four codewords C0, C1, C2, and C3 are performed in a decoder, applying a number of local decoding iterations on the input from the channel 600, which can comprise either or both hard decisions and/or soft information. The number of local decoding iterations applied to each of the codewords C0, C1, C2, and C3 in the decoding operations 602, 604, 606, 608 is in some embodiments an adjustable parameter. As disclosed above with respect to FIG. 7, each of the codewords C0, C1, C2, and C3 includes a portion of the single parity check bits for the example four-codeword data block.

Once the four codewords C0, C1, C2, and C3 have been initially decoded in decoding operations 602, 604, 606, 608, a parity sector update 610 is performed, performing the parity checks specified by the folded parity sector and generating soft information about the user data bits associated with each of the parity checks. The soft information can be buffered in the decoder or in a memory external to the decoder for use in subsequent decoding operations 612, 614, 616, 618 for each of the codewords C0, C1, C2, and C3 which failed to converge during the initial decoding operations 602, 604, 606, 608. Although additional decoding operations 612, 614, 616, 618 are shown in FIG. 8 for each of the codewords C0, C1, C2, and C3, where the codewords C0, C1, C2, and C3 converged during the earlier decoding operations 602, 604, 606, 608 they are omitted from later decoding operations 612, 614, 616, 618.

Soft information from the parity sector update 610 can be combined with information from the channel 600 and used in subsequent decoding operations (e.g., 612, 614, 616, 618) in any suitable manner. For example, in some cases, soft information from the parity sector update 610 is scaled and added to soft information from the channel 600 or from previous decoding operations (e.g., 602, 604, 606, 608) and used to initialize the decoder during subsequent decoding operations.

This decoding process can be continued until all codewords C0, C1, C2, and C3 in the block have converged or until a limit on the number of decoding iterations has been reached, with parity sector updates (e.g., 610, 620) being performed after each round of local decoding operations on all the codewords C0, C1, C2, and C3 in the block.

When the folded parity sector is decoded in an iterative low density parity check decoder, the soft messages containing likelihood values which are passed between a variable node processor and a check node processor provide additional soft information beyond the channel hard decision or soft information input to the decoder. After decoding each of the four codewords C0-C3 with a number of local decoding iterations in the decoder, the parity sector update generates additional soft information that can be used for the next round of C0-C3 decoding, based on the decoder output which contains soft information. Again, the folded parity sector is generated using a number of parity checks that each combine multiple bits from the multiple codewords. Given the folded parity sectors, each parity check in the folded parity sector is based on multiple bits from each codeword, since the codewords were folded and each contributed multiple bits to each parity check that generated the parity sector. These parity checks can be repeated during decoding based on the perceived values in the decoder of those multiple bits from the multiple codewords, and soft information or likelihoods that each of those bits have particular values is generated during the decoding. That soft information or likelihoods about the value of each of those bits can be used during subsequent decoding iterations, passing messages back and forth between the variable node processor and the check node processor as parity checks are performed and perceived bit values or variable node values are updated based on the results of the parity checks. Thus, if any failed codewords remain after a round of decoding on each of the codewords in the block, soft information generated based on earlier decoding iterations of codewords C0-C3 and on parity sector updates of soft information can be used to aid in decoding the failed codewords.

In some embodiments, the first round of decoding operations (e.g., 602, 604, 606, 608) for codewords C0-C3 are configured for faster decoding attempts, for example applying a higher scaling factor to likelihood values, reducing the number of local decoding iterations to perform per codeword, etc. Although the likelihood of successful convergence for the first round of decoding operations (e.g., 602, 604, 606, 608) may be lower than it might otherwise be, settings are selected that result in a good percentage of convergence, and the first parity sector update is performed earlier than it would be otherwise. This results in earlier reprocessing (e.g., in decoding operations 614, 616) of failed codewords (e.g., C1, C2) that did not converge, providing the benefit of soft information from the folded parity sector update. Decoding settings can then be set to more robust values for subsequent reprocessing of failed codewords, for example reducing the scaling factor and increasing the number of local decoding iterations allowed.

Figure 9:
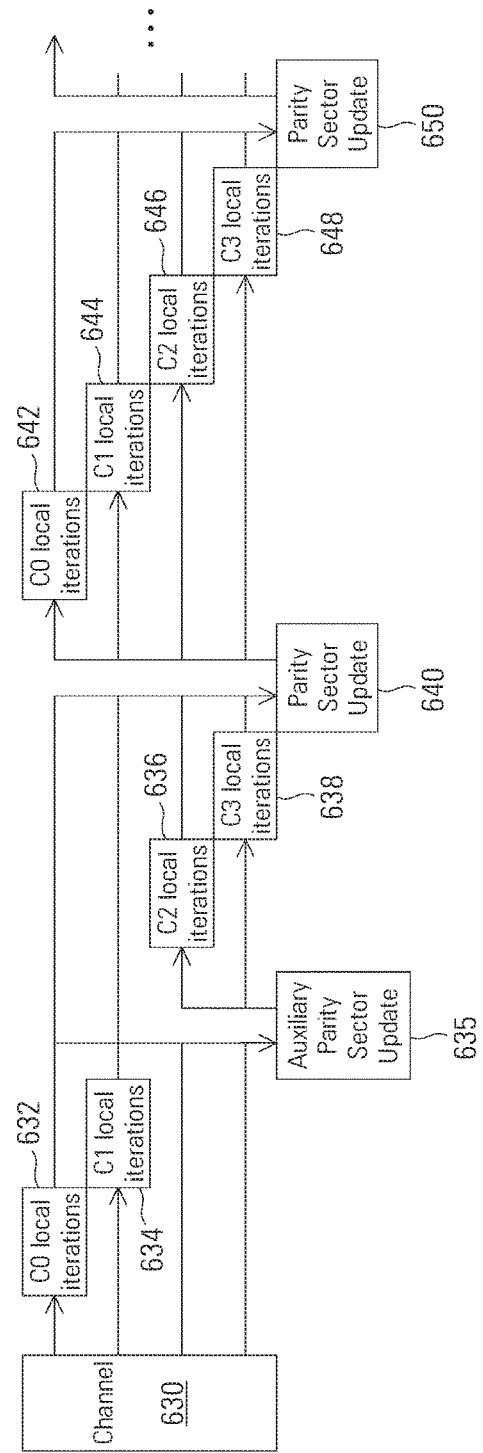
FIG. 9 depicts a scheduling diagram for a decoding operation with auxiliary parity sector updates for a data block with a folded parity sector in accordance with some embodiments of the present invention.

Turning to FIG. 9, in some embodiments auxiliary parity sector updates (e.g., 635) are performed after decoding operations have been completed for a subset of the codewords in the block, which can speed up convergence in some cases by applying folded parity sector information at an earlier stage in the decoding. For example, an auxiliary parity sector update 635 can be performed after completing decoding operations 632, 634 for the first two codewords C0, C1 of four codewords C0, C1, C2, and C3. The auxiliary parity sector update 635 performs parity checks based on the decoding results for the first two codewords C0, C1 and the input from the channel 630. The parity checks specified by the folded parity sector are performed using values of data bits for the first two codewords C0, C1 generated during the decoding operations 632, 634 and values of data bits for the last two codewords C2, C3 taken from the input from the channel 630, with the results of the parity checks used to update soft information and/or hard decisions which can be used to perform decoding operations 636, 638 for the last two codewords C2, C3. Additional parity sector updates 640, 650 and decoding operations 642, 644, 646, 648 for unconverged codewords can continue as disclosed above with respect to FIG. 8.

Figure 10:
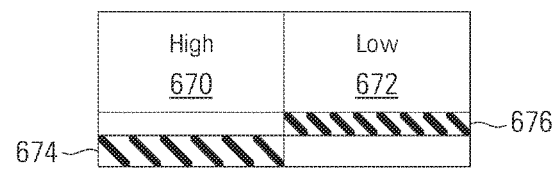
FIG. 10 depicts a portion of a parity check matrix for a data block illustrating uneven folded parity sector protection based on low density parity check column weight in accordance with some embodiments of the present invention.

Again, the folded parity sector portion of the parity check matrix or H matrix of a data block can be designed in any manner to improve decoding performance. As shown in FIG. 10, the folded parity sector portion of the parity check matrix can be manipulated for irregular low density parity check codes, wherein the parity check matrix contains different column weights, meaning that data bits in the block are not all included in the same number of parity check equations. Irregular column weights generally provide improved decoding performance. Although the folded parity sector can be used with any number of different column weights, a portion of an example parity check matrix for an irregular low density parity check code with two different column weights, high and low, is depicted in FIG. 10. Uneven protection can be applied in the folded parity sector based on the column weight in a component codeword, or codeword in a data block. This can be achieved, for example, by changing the folding rate for low column weight and high column weight portions of a data sector when generating the single parity check bits of the folded parity sector. As shown in FIG. 10, the folded parity sector portion 674 of the parity check matrix for a high column weight 670 portion of the parity check matrix can include fewer folds, or more widely spaced offsets between selected bits for the parity check equation, than the folded parity sector portion 676 of the parity check matrix for a low column weight 672 portion of the parity check matrix. This would tend to include more low column weight bits from a data sector than high column weight bits in the parity sector parity check equation. In other embodiments, the correlation between column weight and the number of folds can be reversed.

Figure 11:
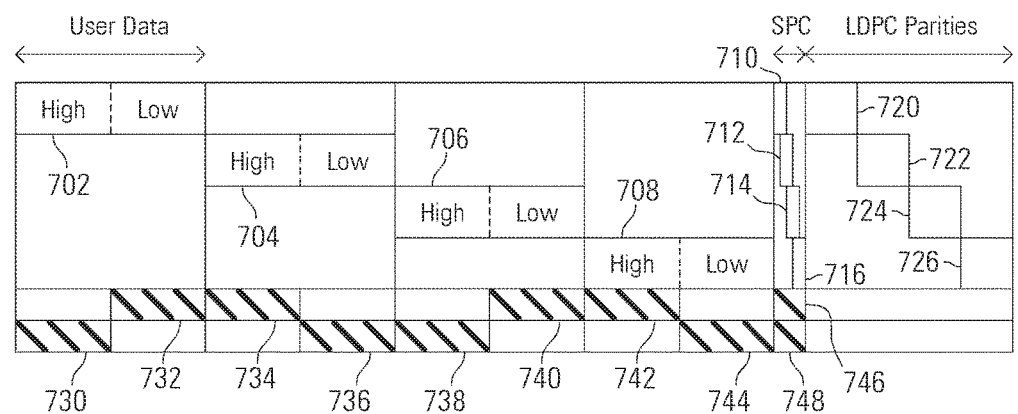
FIG. 11 depicts a parity check matrix with folded parity sector single parity checks and low density parity check parity bits protecting a number of user data sectors, wherein uneven folded parity sector protection based on low density parity check column weight bridges data sectors in accordance with some embodiments of the present invention.

Turning to FIG. 11, a parity check matrix 700 is depicted, wherein uneven folded parity sector protection based on low density parity check column weight bridges data sectors in accordance with some embodiments of the present invention. In this embodiment, connections in the folded parity sector bridge high and low weight columns across component codewords.

Regions 702, 704, 706, 708 represent controller user data for four data sectors, in this example each containing high and low column weight regions. The SPC bits calculated for the four data sectors are divided into four portions 710, 712, 714, 716 each associated with one of the user data sectors, and the user data and SPC bits are LDPC encoded to yield LDPC parity bits 720, 722, 724, 726. Although four LDPC code-words are grouped and protected by a folded parity sector in the H matrix of FIG. 11, any number of codewords can be grouped by the folded parity sector.

The bottom layer of the parity check matrix 700 represents the folded parity sector and defines parity checks that span the grouped user data sectors. In this embodiment, a top layer in the folded parity sector matrix includes connections 732 that select bits in the low column weight portion of the user data 702 for the first component codeword, connections 734 that select bits in the high column weight portion of the user data 704 for the second component codeword, connections 740 that select bits in the low column weight portion of the user data 706 for the third component codeword, and connections 742 that select bits in the high column weight portion of the user data 708 for the fourth component codeword. A bottom layer in the folded parity sector matrix includes connections 730 that select bits in the high column weight portion of the user data 702 for the first component codeword, connections 736 that select bits in the low column weight portion of the user data 704 for the second component codeword, connections 738 that select bits in the high column weight portion of the user data 706 for the third component codeword, and connections 744 that select bits in the low column weight portion of the user data 708 for the fourth component codeword. Notably, connections 732, 734 span low and high column weight portions of the first and second component codewords, connections 736, 738 span low and high column weight portions of the second and third component codewords, and connections 740, 742 span low and high column weight portions of the third and fourth component codewords.

Additionally, various scaling schemes can be applied in a low density parity check decoder in some embodiments to weight likelihood values in check node to variable node messages and in parity sector log likelihood ratio values based on column weights. A scaling factor is applied to likelihood values in check node to variable node messages during iterative decoding, with different scaling factors being applied for different column weights.

Bit selective scaling is applied in some embodiments, scaling the soft information generated during parity sector updates after normal component codeword decoding. The parity sector soft information is scaled using bit selective scaling before it is combined with the channel input for use in subsequent decoding iterations. In some embodiments, parity sector updates include generating parity sector extrinsic messages and parity sector totals. In some of these embodiments, when the sign of the parity sector extrinsic messages differs from the parity sector totals, the parity sector extrinsic messages are scaled down before combining them with the channel input.

In some embodiments, the code rate is partially controlled by applying puncturing or shortening techniques, which reduce the number of bits transmitted or stored. Puncturing involves erasing or zeroing out log likelihood ratio values of some parity bits, so that some portion of the parity bits calculated in the encoder are not transmitted or stored. During decoding, the decoder fills in the missing parity bits using parity checks with other parity bits and user data bits. In some embodiments, puncturing is preferentially performed on parity sector parity bits rather than other component codeword parity bits which are not parity sector protected. Furthermore, in irregular LDPC codes, puncturing is preferentially performed on higher column weight bits for improved system performance. Shortening involves zeroing out user data bits to increase the code rate, which is preferentially performed on high column weight user data bits for improved system performance.

Figure 12:
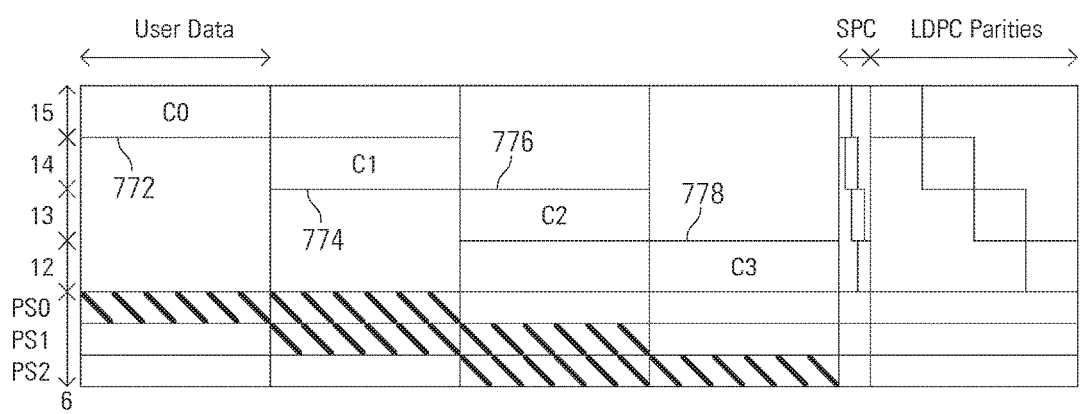
FIG. 12 depicts a parity check matrix with folded parity sector single parity checks and low density parity check parity bits protecting a number of user data sectors, with the folded parity section layer of the parity check matrix supporting auxiliary parity sector updates during decoding in accordance with some embodiments of the present invention.

Turning to FIG. 12, a parity check matrix 770 is depicted in which the folded parity section layer of the parity check matrix supports auxiliary parity sector updates during decoding in accordance with some embodiments of the present invention. Regions 772, 774, 776, 778 represent controller user data for four component codewords C0, C1, C2, C3 for four data sectors, with at least two different code rates. The different code rates can be achieved in any suitable manner, such as, but not limited to, using puncturing to alter the code rate without requiring the decoder to load different H matrices from read only memories on the fly. In this example, each of the four component codewords C0, C1, C2, C3, with the first codeword C0 having 15 circulant rows and the lowest code rate, the second codeword C1 having 14 circulant rows and the second lowest code rate, the third codeword C2 having 13 circulant rows and the third lowest code rate, and the fourth codeword C3 having 12 circulant rows and the highest code rate. The folded parity sector portion of the H matrix has 6 circulant rows in this example.

In this example, each row of the parity sector portion of the H matrix bridges two component codewords. During decoding, the first component codeword C0 is decoded first, which presumably has the best performance with its lowest code rate. An auxiliary parity sector update is performed according to layer PS0 of the parity sector portion of the H matrix using the decoder output for the first component codeword C0, which generates soft information for the second component codeword C1 because layer PS0 bridges the first and second component codewords C0 and C1. The second component codeword C1, the codeword with the next lowest code rate, is then decoded based on the channel input and the soft information generated in the auxiliary parity sector update for layer PS0 of the parity sector portion of the H matrix. An auxiliary parity sector update is performed according to layer PS1 of the parity sector portion of the H matrix using the decoder output for the second component codeword C1, which generates soft information for the third component codeword C2 because layer PS1 bridges the second and third component codewords C1 and C2. The third component codeword C2, the codeword with the next lowest code rate, is then decoded based on the channel input and the soft information generated in the auxiliary parity sector update for layer PS1 of the parity sector portion of the H matrix. An auxiliary parity sector update is performed according to layer PS2 of the parity sector portion of the H matrix using the decoder output for the third component codeword C2, which generates soft information for the fourth component codeword C3 because layer PS2 bridges the third and fourth component codewords C2 and C3. The fourth component codeword C3, the codeword with the highest code rate, is then decoded based on the channel input and the soft information generated in the auxiliary parity sector update for layer PS2 of the parity sector portion of the H matrix.

Masking can be used to control the row weight of the parity sector portion of the H matrix, for example by replacing one identity matrix in every group of four consecutive identity matrices in the folded parity sector matrix by a zero matrix. Again, the number F of folds can be adjusted to balance inner and outer code rates. As the number F is increased, the parity sector portion of the H matrix will have a larger row weight, including more bits from the user data of each codeword. Because a higher row weight is not always desired, the masking scheme can be applied, zeroing out some of the circulants in the Hps parity sector portion of the H matrix, to reduce the row weight of the parity sector portion to improve performance.

In LDPC message passing decoders, the variables are updated every iteration with updated messages from the check nodes. The decoder is initialized with the channel input, which in some embodiments is in the form of reliability information per bit, i.e. log likelihood ratios (LLRs). Consider in general, the n-th input bit, which is associated with variable node n, which receives from the channel an initial message u_ch(n). The extrinsic message from the variable node n to check node in can be represented by:

$$u\_vc(n,m)=f(u\_ch(n),u\_cv(m',n))$$

where m' corresponds to check nodes that are different from m which are neighbors of variable node n, where $f(\ )$ is the local decoding function, and generates a new variable node to check node message.

Similarly, the check node to variable node extrinsic message is given by:

$$u\_cv(m,n)=g(u\_vc(m,n'))$$

and the updated message at the variable node can be expressed by:

$$u\_v(n)=f(u\_ch(n),u\_cv(m,n))$$

In some embodiments, in order to obtain fast decoding convergence, the variable message is updated every iteration according to its reliability. That is, reliable messages will receive saturated LLR values. For example, if a variable node n satisfies the condition $$|LLR(x(n)|u\_v(n)|>TH1$$

where x(n) is the n-th bit, associated with n-th variable node, then its reliability for the next iteration is assigned as |LLR(x(n))|=MAXLLR, with the hard decision specified by the variable node to check node message.

The threshold TH1 can be changed every iteration, such that the decoding iterations have fast convergence. This approach can be useful for obtaining low average decoding latency, which is especially important in storage applications, where read-performance depends on the error decoding latency. On most working points of the storage device, across its lifespan, fast convergence may be achieved with this log likelihood ratio saturation. On rare cases of decode failure, a new decoding attempt may be done with a different set of log likelihood ratio saturation thresholds per iteration.

Figure 13:
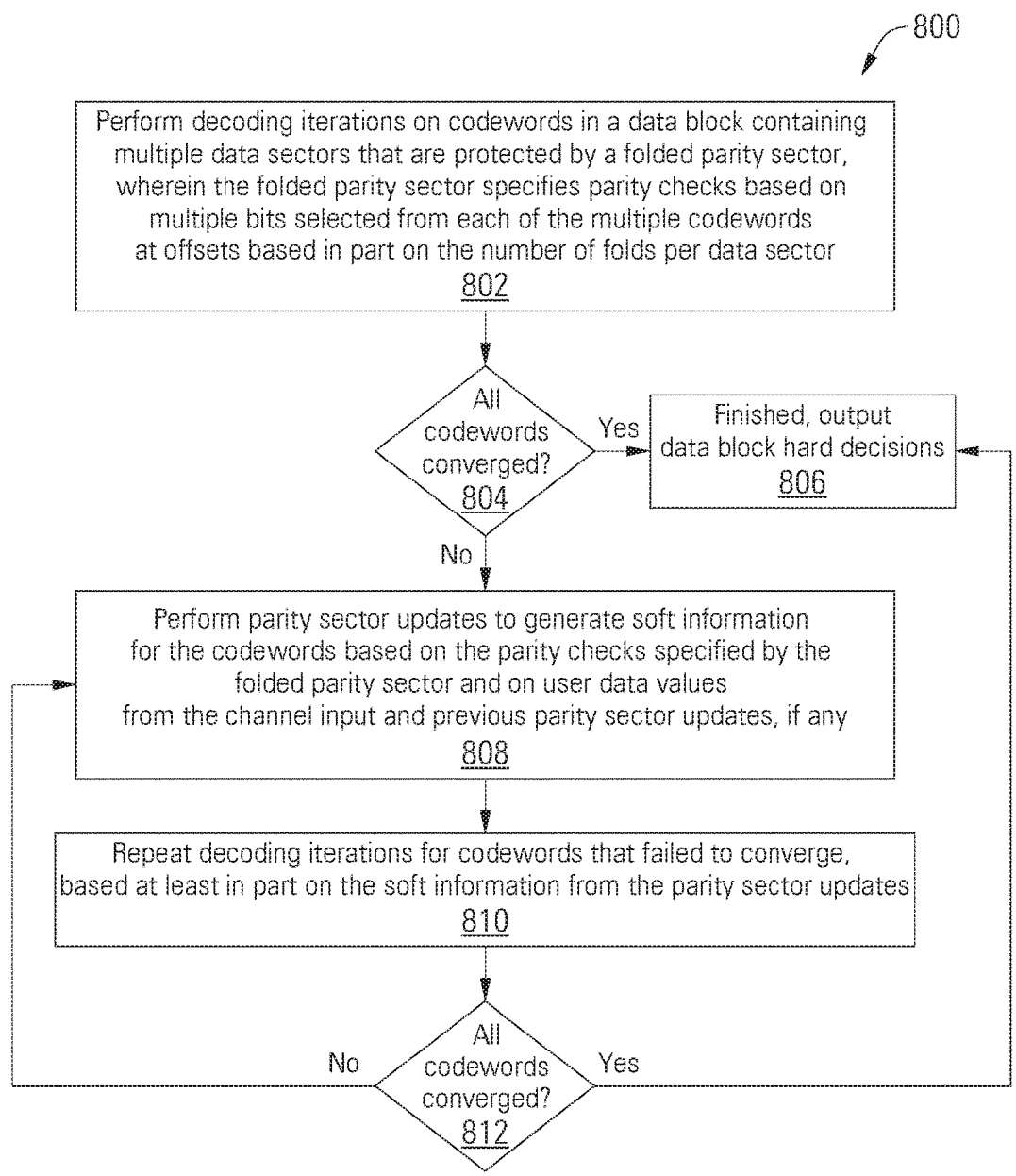
FIG. 13 is a flow diagram of a method to process data in a read channel with folded parity sector processing in accordance with some embodiments of the present invention.

Turning to FIG. 13, a flow diagram 800 depicts a method to process data in a read channel with folded parity sector processing in accordance with some embodiments of the present invention. Following flow diagram 800, decoding iterations are performed on codewords in a data block containing multiple data sectors that are protected by a folded parity sector, wherein the folded parity sector specifies parity checks based on multiple bits selected from each of the multiple codewords at offsets based in part on the number of folds per data sector. (Block 802) A determination is made as to whether all codewords have converged. (Block 804) If all codewords have converged, decoding is finished and the hard decisions for the data block are output. (Block 806) If at least one codeword has not converged, parity sector updates are performed to generate soft information for the codewords based on the parity checks specified by the folded parity sector and on user data values from the channel input and previous parity sector updates, if any, (Block 808) Decoding iterations are repeated for codewords that failed to converge, based at least in part on the soft information from the parity sector updates. (Block 810) A determination is made as to whether all codewords have converged. (Block 812) If all codewords have converged, decoding is finished and the hard decisions for the data block are output. (Block 806) If at least one codeword has still not converged, the process continues with Block 808. The number of decoding rounds can also be limited to avoid endless decoding loops for failed codewords.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, embodiments of the present invention provide novel systems, devices, methods and arrangements for folded parity sector processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of embodiments of the invention which are encompassed by the appended claims.

What is claimed is:

1. An apparatus for processing data from a non-volatile storage device, comprising:
   a decoder configured to iteratively decode codewords in a data block representing a plurality of user data sectors, the codewords comprising user data, folded parity sector data and error correction code parity bits, wherein the folded parity sector data comprises a plurality of parity checks, each comprising a plurality of user data bits from each of the data sectors with an offset between each of the plurality of user data bits from the data sectors determined at least in part by a number of folds in the data sectors; and
   a scheduler configured to control decoding of the codewords based at least in part on the folded parity sector data.

2. The apparatus of claim 1, wherein the data decoder comprises a low density parity check decoder.

3. The apparatus of claim 1, wherein the scheduler is configured to schedule a plurality of decoding iterations in the decoder for each of the plurality of user data sectors and to schedule an update of the parity sector data based on results of the plurality of decoding iterations.

4. The apparatus of claim 1, wherein the decoder is configured to decode the codewords according to a parity check matrix for the data block comprising a plurality of component codeword parity check matrices, one for each of the codewords, the parity check matrix for the data block further comprising single parity check bits that satisfy parity check equations in the folded parity sector data, error correction code parity bits for the codewords, and a parity check matrix for the folded parity sector data.

5. The apparatus of claim 4, wherein the single parity check bits are protected by the error correction code parity bits.

6. The apparatus of claim 1, wherein the decoder is configured to perform parity sector updates to perform parity checks of bits in the user data specified by the folded parity sector data to generate soft information.

7. The apparatus of claim 6, wherein the decoder is configured to repeat decoding iterations for the codewords that fail to converge in earlier decoding iterations, wherein the repeated decoding iterations are performed in part based on the soft information.

8. The apparatus of claim 6, wherein the decoder is configured to perform auxiliary parity sector updates after a subset of the codewords in the data block have been decoded.

9. The apparatus of claim 1, wherein the decoder comprises memory configured to store carry-on decoding state information.

10. The apparatus of claim 1, wherein the decoder comprises an irregular low density parity check decoder, and wherein the folded parity sector data parity checks specify different numbers of the user data bits based on column weights.

11. The apparatus of claim 10, wherein the folded parity sector data parity checks specify the user data bits that bridge high and low column weight portions of combinations of the codewords.

12. The apparatus of claim 1, wherein the decoder is configured to calculate values of parity bits that have been punctured.

13. The apparatus of claim 12, wherein the punctured parity bits comprise high column weight parity bits in an irregular low density parity check decoder.

14. The apparatus of claim 1, wherein the decoder comprises an irregular low density parity check decoder configured to calculate values of high column weight user data bits that have been shortened.

15. The apparatus of claim 1, wherein the codewords have a plurality of code rates and wherein the scheduler is configured to schedule decoding of the codewords in order of ascending code rates.

16. The apparatus of claim 15, wherein the folded parity sector data comprises a plurality of layers of parity checks that bridge neighboring codewords in order of ascending code rates.

17. The apparatus of claim 1, wherein the decoder comprises an irregular low density parity check decoder configured to scale check node to variable node messages based at least in part on column weights.

18. The apparatus of claim 1, wherein the decoder is configured to apply bit selective scaling to the folded parity sector data.

19. A method of processing data from a non-volatile storage device, comprising:
   performing decoding iterations on a plurality of codewords in a data block each associated with a user data sector, wherein the plurality of codewords are protected by a folded parity sector, wherein the folded parity sector specifies parity checks based on multiple bits selected from each of the user data sectors at offsets based in part on a number of folds per user data sector;
   performing a parity sector update to generate soft information for the codewords based at least in part on the parity checks specified by the folded parity sector and on the user data sectors; and
   repeating the decoding iterations for any of the codewords that failed to converge, based at least in part on the soft information from the parity sector update.

20. A storage system comprising:
   a storage medium;
   means for decoding codewords in a data block stored on the storage medium, the data block representing a plurality of user data sectors, the codewords comprising user data, folded parity sector data and error correction code parity bits, wherein the folded parity sector data comprises a plurality of parity checks, each comprising a plurality of user data bits from each of the data sectors with an offset between each of the plurality of user data bits from the data sectors determined at least in part by a number of folds in the data sectors; and
   means for scheduling decoding of the codewords based at least in part on the folded parity sector data.

* * * * *